United States Patent [19]

Tanner et al.

[11] 4,112,377
[45] Sep. 5, 1978

[54] C. B. CONVERTER

[75] Inventors: James L. Tanner, Reseda; Bruno A. Rist, Northridge, both of Calif.

[73] Assignee: Tanner Electronic Systems Technology, Van Nuys, Calif.

[21] Appl. No.: 741,659

[22] Filed: Nov. 15, 1976

Related U.S. Application Data

[63] Continuation of Ser. No. 648,836, Jan. 14, 1976, abandoned.

[51] Int. Cl.² .............................................. H04B 1/18
[52] U.S. Cl. .................................... 325/461; 325/440; 325/451
[58] Field of Search ................... 325/440, 441, 15, 16, 325/18-22, 312, 451, 461, 458; 330/35; 333/70 CR

[56] References Cited

U.S. PATENT DOCUMENTS

| | | | |
|---|---|---|---|
| 2,760,061 | 8/1956 | Pan et al. | 325/461 |
| 3,348,154 | 10/1967 | Fish, Jr. et al. | 325/451 |
| 3,348,155 | 10/1967 | Von Recklinghausen | 325/440 |
| 3,404,347 | 10/1968 | Kaplan et al. | 330/35 |
| 3,447,088 | 5/1969 | Guyton et al. | 325/21 |
| 3,482,167 | 12/1969 | Kaplan et al. | 330/35 |
| 3,510,781 | 5/1970 | Wollesen | 325/451 |
| 3,555,430 | 1/1971 | Fischer et al. | 325/461 |
| 3,571,723 | 3/1971 | Ogusu | 325/461 |
| 3,665,310 | 5/1972 | Tweed, Jr. | 325/21 |

OTHER PUBLICATIONS

"Handbook of Semiconductor Electronics"–Lloyd P. Hunter, McGraw-Hill, 1970, pp. 17-38 – 17-42.

Primary Examiner—Robert L. Griffin
Assistant Examiner—Marc E. Bookbinder
Attorney, Agent, or Firm—Herzig & Walsh Incorporated

[57] ABSTRACT

A converter is disclosed for converting 23-channel citizens band to provide citizens band reception through a standard radio, preferably an automobile radio. The circuit is comprised of an RF amplifier and self-oscillating converter which is switched into the antenna connections of an automobile radio. Conventional auto antenna connectors facilitate easy installation. A pushbutton switch connects the citizens band converter into the line connecting the antenna with the radio. The pushbutton switch also grounds the converter output when switched to standard radio to prevent interference with standard radio reception.

6 Claims, 3 Drawing Figures

C. B. CONVERTER

This is a continuation of application Ser. No. 648,836 filed Jan. 14, 1976, and now abandoned.

BACKGROUND OF THE INVENTION

This invention relates to frequency converters and more particularly relates to a frequency converter for converting and coupling 23-channel citizens band broadcasts to a standard radio.

Citizens band frequency converters are known in the art but they generally do not have adequate sensitivity and are excessively expensive. Thus, previous citizens band converters have not achieved wide commerical success. There is a need for an efficient inexpensive converter because citizens band broadcasts can provide information on emergencies, traffic conditions and weather.

SUMMARY OF THE INVENTION

The circuitry employs two inexpensive dual-gate FET's in an RF amplifier configured to improve sensitivity and a stabilized self-oscillating converter. The input tuner stage and output circuits can be tuned for maximum gain and selectivity. The oscillator section of the converter is fix tuned and the desired citizens band channel is selected by turning the AM radio between approximately the frequencies of 0.925 MHZ and 1.25 MHZ. The system operates on twelve volts and an inexpensive voltage regulation circuit is used to assure stability of the oscillator at all speeds and charge levels of the auto battery.

It is one object of the present invention to provide a citizens band converter which has improved sensitivity and selectivity.

It is another object of the present invention to provide a citizens band converter which may be easily coupled into the antenna line of an automobile radio.

Still another object of the present invention is to provide a citizens band converter which has high gain and stability and yet is inexpensive to construct.

These and other objects of the invention will become apparent from the following detailed description of the invention when considered in conjunction with the accompanying drawings, wherein like reference numbers are used.

DETAILED DESCRIPTION OF THE PREFERRED EMBODIMENT

Figure 1:
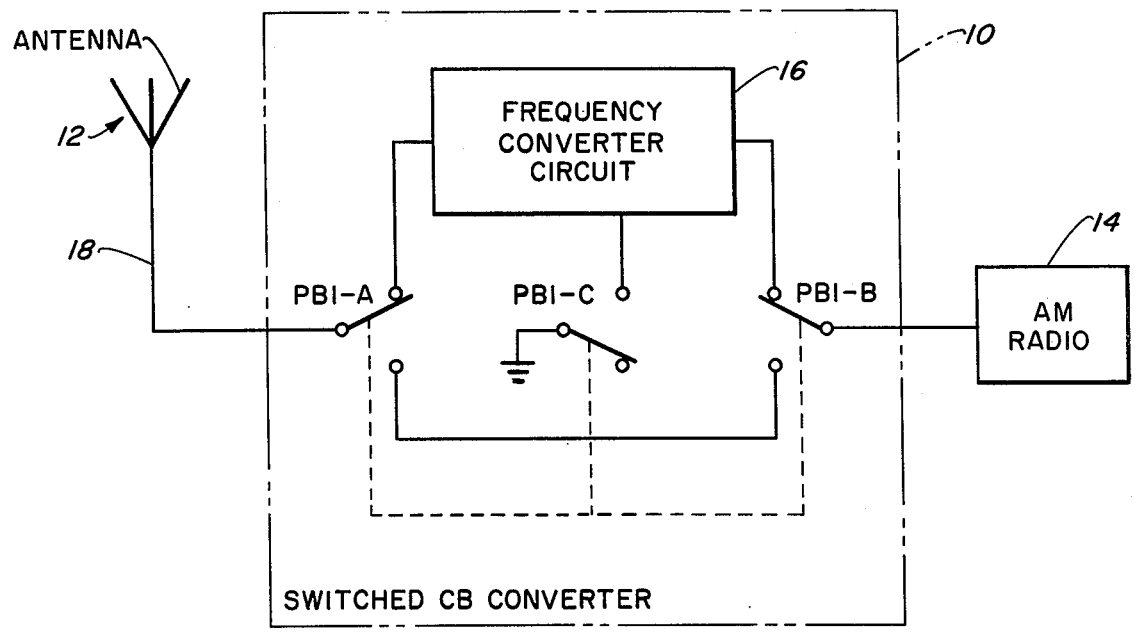
FIG. 1 is a block diagram illustrating the manner in which the C.B. converter is switched in and out of an automobile radio circuit.

Referring to FIG. 1 there is shown a switched citizens band converter circuit at 10, which is switched in and out of the connection between antenna 12 and a standard AM radio 14, which is preferably an automobile radio. The switching is accomplished by a ganged pushbutton switch PB1 A–C. The switch connects the frequency converter circuit 16 into the line 18 between the antenna 12 and the AM radio 14. The switch section PB1 – C grounds the output of frequency converter circuit when switched to standard broadcast to prevent interference sometimes known as "birdies" in the radio.

Figure 2:
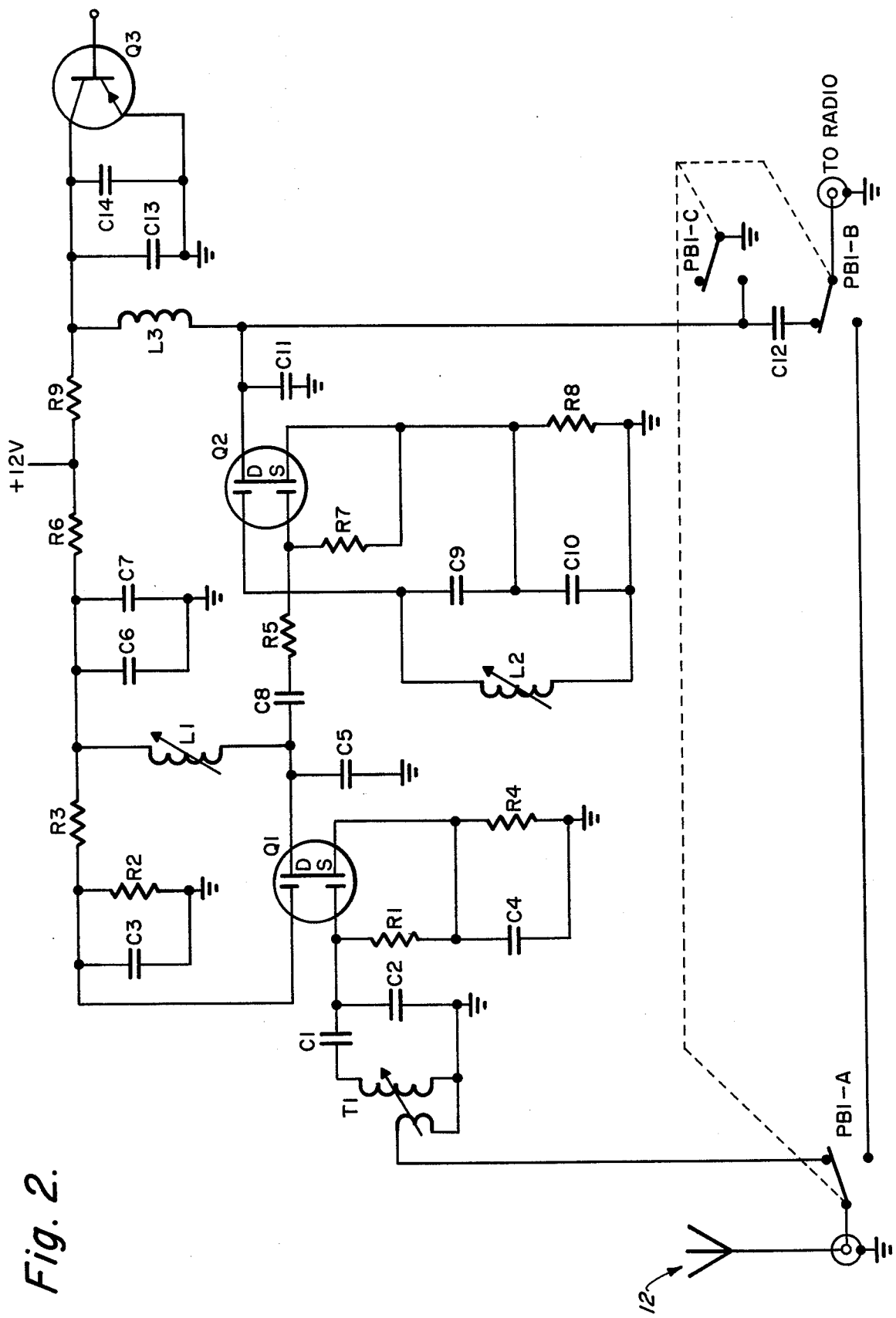
FIG. 2 is a schematic diagram of the C.B. converter circuit.

The schematic diagram of the frequency converter circuit 16 is shown in FIG. 2. The antenna 12 is connected by switch section PB1 – A to a tuned transformer T1 which has input coupling tapped down to match the input impedance of a dual-gate FET Q1. The dual-gate field effect transistor Q1 is connected as a stagger tuned RF amplifier. This RF amplifier arrangement provides increased sensitivity at relatively low cost for the frequency converter.

The output of the RF amplifer is coupled to the self-oscillating converter, sometimes called an autodyne circuit, by capacitor C8 and resistor R5 in series to prevent parasitic oscillations. The signal is then processed by the converter stage comprised of field effect transistor Q2, coil L2 and capacitor C9 and C10. These are connected as an autodyne converter which oscillates by positive feedback. The output of the field effect transistor Q2 is tuned to peak near the center of the broadcast band at approximately 900 to 1200 KHz when connected to the AM radio.

In order to keep the circuit relatively inexpensive, zener regulation is provided by transistor Q3 which controls the voltage to transistor Q2 to stabilize the oscillator. Filtering is provided by capacitor C6 and C7, C13 and C14.

The broadcast output of the self-oscillating converter Q2 is tuned primarily by the AM radio front end circuit. However, the output of the converter Q2 parallels the AM radio circuit with capacitor C11 and coil L3. The coil L3 is required to de-couple the drain of Q2 from the 12-volt power supply. The capacitor C11 tunes the combination LC to the desired center frequency which is preselected to be approximately 1.070 Mhz.

Figure 3:
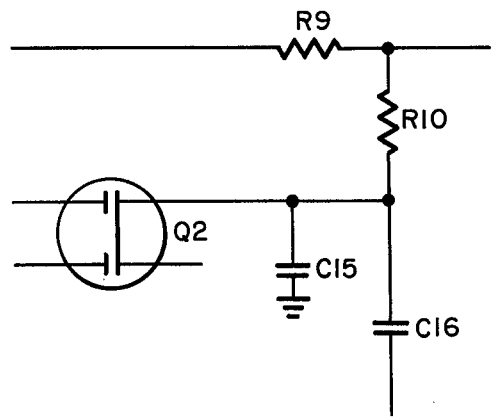
FIG. 3 is a schematic diagram illustrating an alternate output circuit.

An alternate output circuit is illustrated in FIG. 3 for coupling the converter to the AM radio. This alternate circuit uses an output resistor R10 in place of the inducter L3. The output is then coupled to the AM radio by capacitor C12 having a value of about 30 to 60 pf.

For proper self-oscillating operation of Q2, the resistor R10 is shunted with a capacitor C13. This alternate circuit, although reducing the overall expense of the circuit, suffers a small attenuation of the supply to the transistor Q2 and therefore is more sensitive to FET production variations because of this voltage drop.

The citizens band input is link coupled to the RF amplifier stage input tuned circuit to virtually ground the antenna at broadcast frequencies and to minimize de-tuning the 27 MHz input circuit. How effective the circuit is at maintaining input resonance depends upon the gain needed and variations at 27 megahertz between automobile antennas. For optimum performance it is preferable to tune the input circuit. The 12-volt supply to the RF amplifier and autodyne converter are individually de-coupled. The zener voltage regulation of transistor Q3 is applied to the converter and it is desirable to have a capacitor across the zener regulator to eliminate noise. The RF amplifier Q1 is de-coupled by capacitor C6 and C7 and resistor R6. The converter is on all the time and draws only a small current. However, when the frequency converter is switched out of the antenna line, the output of the converter circuit Q2 is shunted to ground by section PB1 – C to defeat the output of the local oscillator and assure trouble-free reception.

The center channel of the citizens band frequency-wise is channel 13 at about 27.115 Mhz. To place this channel at approximately the center of the AM dial 1.070 Mhz, a local oscillator of 26.045 Mhz is required. The two 27 megahertz tuned circuits are stagger tuned in order to cover the entire CB band. For optimum autodyne converter operation, the autodyne input coil L2 is aligned "high" at approximately channel 16, 27.115 Mhz.

Obviously, many modifications and variations of the present invention are possible in light of the above teachings. It is therefore to be understood that the full scope of the invention is not limited to the details disclosed herein and may be practiced otherwise than as specifically described herein.

What is claimed is:

1. A system for converting a standard radio to a citizens band receiver comprising:
    stagger-tuned RF amplifier means for receiving and amplifying citizens band transmissions;
    dual-gate field effect transistor means connected to said stagger-tuned RF amplifier means as a self-oscillating converter for converting citizens band transmissions to the AM frequency band;
    switch means for switching said standard radio from standard broadcast to citizens band reception by disconnecting or connecting the input of said stagger-tuned RF amplifier means and the output of said self-oscillating converter in and out of the antenna line of the radio; and
    coupling means coupling the output of said self-oscillating converter to said switch means.

2. The system according to claim 1 wherein said switch means comprises:
    means for connecting the output of said coupling means to the antenna input of said radio; and
    means for grounding the output of said self-oscillating converter when said switch means is in the standard radio position.

3. The system according to claim 1, wherein said stagger-tuned RF amplifier means comprises dual-gate field effect transistor means other than said first-mentioned dual-gate field effect transistor means; and further including a tuned transformer connected to a first gate of said second-mentioned dual-gate field effect transistor means, and a tuned coil connected to the drain of said first-mentioned dual-gate field effect transistor, and wherein said switch means includes means to connect to ground, the output of said self-oscillating converter when the latter is switched out of the antenna line of the radio.

4. The circuit according to claim 1, including, zener regulator means for stabilizing said self-oscillating converter.

5. The circuit according to claim 4 wherein said regulator means comprises a transistor connected as a zener regulator.

6. A system for affording the capability of citizens band broadcast to a standard radio comprising:
    dual-gate field effect transistor means connected as self-oscillating converter means for converting citizens band transmissions to the AM frequency band;
    coupling means coupled to the output of said dual-gate field effect transistor means and connectable to the antenna line of said radio; and
    switch means for switching said radio from standard broadcast to citizens band broadcast, said coupling means being connectable to the input of the antenna line of said radio in response to switching by said switch means, said switch means including means for grounding the output of said coupling means upon switching into the standard broadcast mode.

* * * * *